United States Patent
Miyoshi

(10) Patent No.: US 10,290,770 B2
(45) Date of Patent: May 14, 2019

(54) NITRIDE SEMICONDUCTOR LIGHT-EMITTING ELEMENT

(71) Applicant: USHIO DENKI KABUSHIKI KAISHA, Tokyo (JP)

(72) Inventor: Kohei Miyoshi, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/769,549

(22) PCT Filed: Oct. 19, 2016

(86) PCT No.: PCT/JP2016/080980
§ 371 (c)(1),
(2) Date: Apr. 19, 2018

(87) PCT Pub. No.: WO2017/069159
PCT Pub. Date: Apr. 27, 2017

(65) Prior Publication Data
US 2018/0309024 A1 Oct. 25, 2018

(30) Foreign Application Priority Data
Oct. 22, 2015 (JP) ................................ 2015-208434

(51) Int. Cl.
*C30B 25/18* (2006.01)
*C30B 25/20* (2006.01)
(Continued)

(52) U.S. Cl.
CPC ............ *H01L 33/32* (2013.01); *C30B 25/183* (2013.01); *C30B 29/406* (2013.01);
(Continued)

(58) Field of Classification Search
None
See application file for complete search history.

(56) References Cited

U.S. PATENT DOCUMENTS 6,996,150 B1 * 2/2006 Shakuda ............... H01L 33/007
257/E33.005
2008/0164578 A1 * 7/2008 Tanikella ................ C30B 29/20
257/628
(Continued)

FOREIGN PATENT DOCUMENTS

JP 2013-230972 A 11/2013

OTHER PUBLICATIONS

Jiang, Yang, et al. "Realization of High-Luminous-Efficiency InGaN Light-Emitting Diodes in the 'Green Gap' Range." Scientific Reports, vol. 5, No. 1, 2015, doi:10.1038/srep10883.*
(Continued)

*Primary Examiner* — J. E. Schoenholtz
(74) *Attorney, Agent, or Firm* — Studebaker & Brackett PC

(57) ABSTRACT

A nitride semiconductor light-emitting element having a main emission wavelength of 520 nm or more, including a sapphire substrate, and a semiconductor layer formed on an upper layer of the sapphire substrate. The semiconductor layer includes: a first semiconductor layer formed on a surface of the sapphire substrate; a second semiconductor layer formed on an upper layer of a first semiconductor layer, and doped with n-type or p-type impurities; an active layer formed on an upper layer of the second semiconductor; and a third semiconductor layer formed on an upper layer of the active layer, and having a different conductivity type than the second semiconductor layer. The thickness X of the sapphire substrate and the thickness Y of the semiconductor layer satisfy the relationship $0.06 \leq Y/X \leq 0.12$.

12 Claims, 8 Drawing Sheets

(51) Int. Cl.
  *C30B 29/40* (2006.01)
  *H01L 33/00* (2010.01)
  *H01L 33/18* (2010.01)
  *H01L 33/32* (2010.01)
  *H01L 33/50* (2010.01)

(52) U.S. Cl.
  CPC .......... *H01L 33/0008* (2013.01); *H01L 33/18* (2013.01); *H01L 33/502* (2013.01); *C30B 25/20* (2013.01)

(56) References Cited

U.S. PATENT DOCUMENTS

| | | | |
|---|---|---|---|
| 2010/0038656 A1* | 2/2010 | Zimmerman | C30B 25/02 257/88 |
| 2010/0148212 A1 | 6/2010 | Fujito et al. | |
| 2018/0010246 A1* | 1/2018 | Nemoto | C23C 16/34 |

OTHER PUBLICATIONS

Sapphire Data Sheet, ISO Optics, downloaded from URL<https://www.janis.com/Libraries/Window_Transmissions/Sapphire_Al2O3_TransmissionCurveDataSheet.sflb.ashx> on Sep. 28, 2018.*

Dietholm, E., "Operational Procedures for the Thin Film Stress Instrument", University of Texas at Dallas, Apr. 13, 2004 downloaded from URL<http://www.utdallas.edu/~gpp052000/Docs/TohoStressOperationManual.pdf> on Sep. 28, 2018.*

Liu, Jun-Lin, et al. "Status of GaN-Based Green Light-Emitting Diodes." Chinese Physics B, vol. 24, No. 6, 2015, p. 067804., doi:10.1088/1674-1056/24/6/067804.*

Notification of Transmittal of Translation of the International Preliminary Report on Patentability (Chapter I) and Translation of Written Opinion of the International Searching Authority; PCT/JP2016/080980; dated May 3, 2018.

International Search Report issued in PCT/JP2016/080980; dated Nov. 22, 2016.

* cited by examiner

| | Thickness X of the sapphire substrate 2 [μm] | | | | | |
|---|---|---|---|---|---|---|
| Thickness Y of the semiconductor layer 3 [μm] | 60 | 80 | 100 | 120 | 140 | 160 |
| 3 | B | B | B | B | B | B |
| 6 | A | A | A | B | B | B |
| 9 | B | C | A | A | A | B |
| 12 | B | C | C | A | A | A |
| 15 | B | C | C | C | C | A |
| 20 | B | C | C | C | C | C |

(a)

(b)

(a) Thickness Y of the semiconductor layer 3 = 4 [μm]

(b) Thickness Y of the semiconductor layer 3 = 5 [μm]

(a) Thickness Y of the semiconductor layer 3 = 6 [μm]

(b) Thickness Y of the semiconductor layer 3 = 10 [μm]

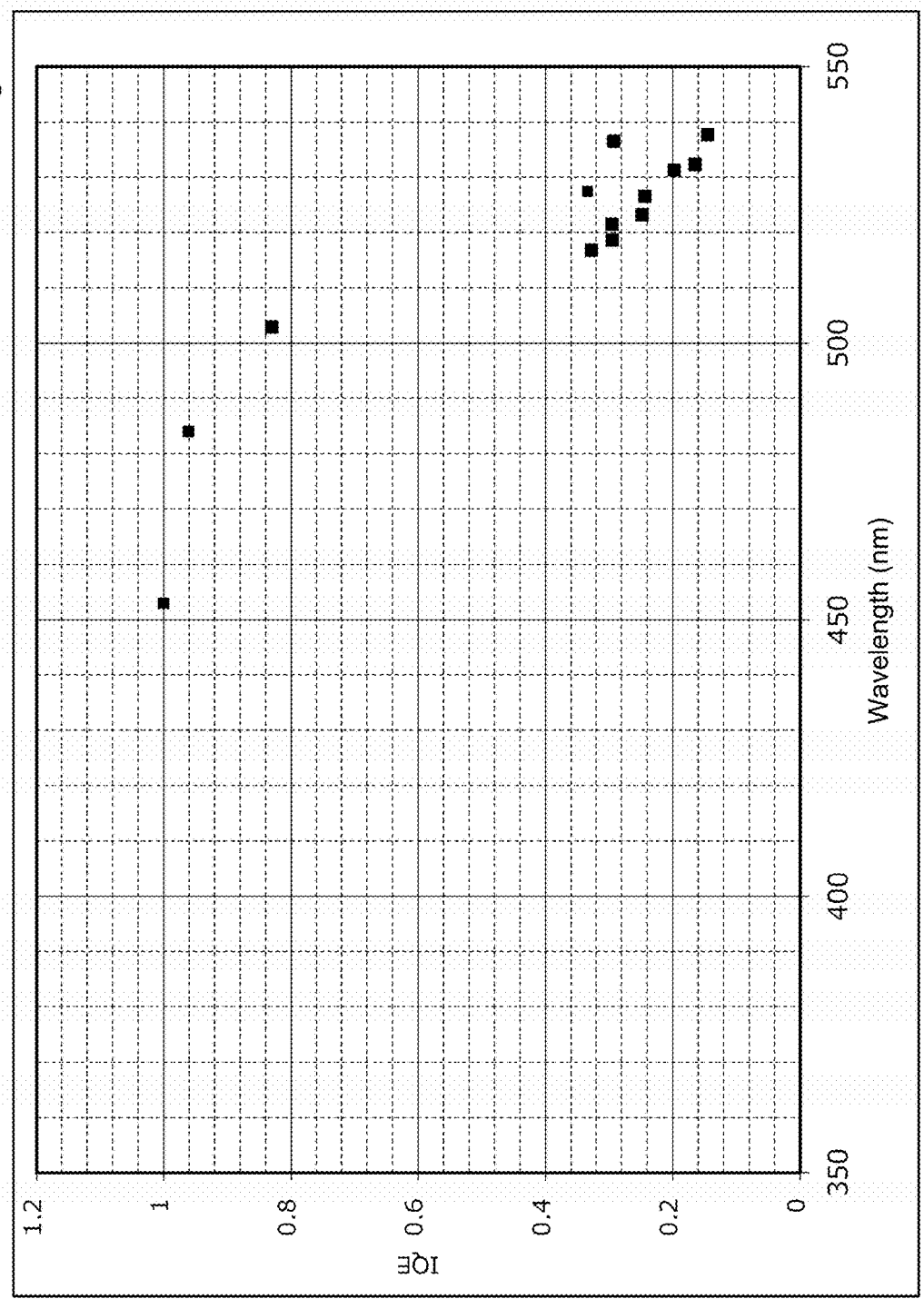

NITRIDE SEMICONDUCTOR LIGHT-EMITTING ELEMENT

TECHNICAL FIELD

The present invention relates to a nitride semiconductor light-emitting element and, more particularly, relates to a nitride semiconductor light-emitting element having main emission wavelength of greater than or equal to 520 nm.

BACKGROUND ART

In recent years, development of projectors, medical inspection devices, soil analysis devices and the like using a semiconductor light-emitting element having an emission wavelength in the visible light range has been advanced. As a semiconductor light-emitting element having an emission wavelength in the visible light range, conventionally, a GaP-based compound semiconductor has been mainly used. However, the GaP-based compound semiconductor is a semiconductor having an indirect-transition type band structure, and has lower transition probability, which has made it hard to increase the light emission efficiency therewith. In light of this, development of semiconductor light-emitting elements having an emission wavelength in the visible light range is advanced by using a material based on a nitride semiconductor which is a direct-transition type semiconductor.

However, at the present time, a semiconductor light-emitting element capable of emitting light in wavelength region of greater than or equal to 520 nm in particular within the visible light range with higher efficiency has not been realized. FIG. 10 is a graph showing the relationship between the main emission wavelength and the internal quantum efficiency. In FIG. 10, the horizontal axis corresponds to the main emission wavelength, while the vertical axis corresponds to the internal quantum efficiency (IQE). Referring to FIG. 10, it can be seen that the internal quantum efficiency abruptly decreases, when the main emission wavelength exceeds 520 nm. The wavelength region in which the internal quantum efficiency decreases as described above is called a "green gap region," and the decrease in efficiency in such a wavelength region is problematic irrespectively of the GaP or nitride semiconductor. This leads to the demand of elevating the internal quantum efficiency in the green gap region to improve the light emission efficiency of a semiconductor light-emitting element.

As one of the reasons for the decrease in light emission efficiency, particularly, in the wavelength region of greater than or equal to 520 nm, decrease in recombination probability between an electron and a hole in the active layer caused by an internal electric field (a piezoelectric field) can be recited. This point is now described by taking a nitride semiconductor as an example.

A nitride semiconductor such as GaN and AlGaN has a wurtzite crystal structure (hexagonal crystal structure). Regarding planes of the wurtzite crystal structure, the crystal plane and the orientations are expressed by using fundamental vectors represented by a1, a2, a3 and c, according to the 4 index notation (hexagonal crystal indexes). The fundamental vector c extends in the [0001] direction, and this direction is called "c-axis". The plane perpendicular to the c-axis is called "c-plane" or "(0001) plane".

Conventionally, in production of a semiconductor light-emitting element using a nitride semiconductor, a substrate having a c-plane substrate as the main face is used as a substrate on which nitride semiconductor crystals are to be grown. Actually, a GaN layer is grown on this substrate at a low temperature, and further a nitride semiconductor layer is grown above the GaN layer. As an active layer that constitutes a layer contributing to light emission, InGaN which is a mixed crystal of GaN and InN is commonly used.

Here, there is a difference in lattice constant between GaN and InN. To be more specific, regarding the a-axial direction, the lattice constant of GaN is 0.319 nm, and the lattice constant of InN is 0.354 nm. Therefore, when an InGaN layer containing InN having a larger lattice constant than GaN is grown above the GaN layer, the InGaN layer receives a compressive strain in the direction perpendicular to the growing face. At this time, the balance of polarization between Ga and IN having positive charge and N having negative charge is disrupted, and an electric field (a piezoelectric field) along the c-axis is generated. As the piezoelectric field is generated in the active layer, the band of the active layer bends and the degree of overlapping between wave functions of the electron and the hole decreases, so that the recombination probability between the electron and the hole in the active layer decreases (so-called "quantum-confined Stark effect"). As a result, the internal quantum efficiency decreases.

For the purpose of achieving the emission wavelength of greater than or equal to 520 nm, it is necessary to increase the In composition contained in an active layer (particularly, a light emitting layer) so as to realize a band gap energy suited for the wavelength. However, when the In composition is increased, the compressive strain increases, and thus the piezoelectric field increases. This results in further deterioration in the internal quantum efficiency.

As a method for increasing the internal quantum efficiency, for example, Patent Document 1 which will be described later gives considerations about a light-emitting element adapted to prevent occurrences of a piezoelectric field in an active layer, by growing the active layer using a substrate having a (10-10) plane called an m-plane, which is normal to a [10-10] direction, for example.

PRIOR ART DOCUMENT

Patent Document

Patent Document 1: JP-A-2013-230972

SUMMARY OF THE INVENTION

Problems to be Solved by the Invention

It is an object of the present invention to elevate the light emission efficiency than ever before in the semiconductor light-emitting element having a main emission wavelength of greater than or equal to 520 nm.

Means for Solving the Problem

The present invention provides a nitride semiconductor light-emitting element having a main emission wavelength of greater than or equal to 520 nm, including:

the nitride semiconductor light-emitting element comprising a sapphire substrate and a semiconductor layer formed on an upper surface of the sapphire substrate, wherein the semiconductor layer includes a first semiconductor layer which is formed on a surface of the sapphire substrate and is formed from a nitride semiconductor containing Ga, a second semiconductor layer which is formed on an upper surface of the first semiconductor layer and is formed from a nitride semiconductor containing Ga and doped with an n-type impurity with a higher concentration than that of the first semiconductor layer, an active layer which is formed on an upper surface of the second semiconductor layer and includes light emitting layers formed from a nitride semiconductor containing In and Ga and barrier layers formed from a nitride semiconductor containing Ga which are laminated on each other in two or more cycles, and a third semiconductor layer which is formed on an upper surface of the active layer and is formed from a nitride semiconductor containing Ga and doped with a p-type impurity, and a thickness X of the sapphire substrate and a thickness Y of the semiconductor layer satisfy a relationship in the following formula (1).

$$0.06 \leq Y/X \leq 0.12 \tag{1}$$

As described above, conventionally, when a light-emitting element having main emission wavelengths of greater than or equal to 520 nm are realized with nitride semiconductors, this light-emitting element have exhibited only lower light emitting efficiency. This is due to a piezoelectric field caused by internal stresses existing in an active layer. The present inventor has found the following, from earnest studies. That is, by making the ratio of the thickness of the semiconductor layer to the thickness of the sapphire substrate larger than that in a conventionally-assumed semiconductor light-emitting element, it is possible to distort the shape of the light-emitting element itself in such a direction as to reduce residual stresses, thereby reducing internal stresses within the active layer. With this structure, it is possible to realize a nitride semiconductor light-emitting element having light emitting efficiency improved over conventional elements. This will be described in detail in the section of "MODE FOR CARRYING OUT THE INVENTION".

Further, the present inventor has found that it is possible to provide an effect of improving the crystallinity in the active layer, by forming the semiconductor layer such that it has a larger film thickness than that of a conventional element. This effect prominently appears when the semiconductor layer has a thickness of 6 μm or more, particularly. This can further improve the light emitting efficiency.

In the aforementioned structure, the first semiconductor layer can be constituted by an undoped layer.

Further, in the aforementioned structure, the thickness of the second semiconductor layer can be made larger than the thickness of the first semiconductor layer. Namely, it is possible to satisfy the aforementioned formula (1), by forming the n-type semiconductor layer such that it has a larger thickness, in comparison with a conventional structure. This can reduce the internal resistance value, while improving the internal quantum efficiency.

Further, in the aforementioned structure, the second semiconductor layer can include a layer formed from a nitride semiconductor containing Al and Ga. For example, by including a layer formed from a semiconductor containing Al, such as AlGaN, in the second semiconductor layer, it is possible to further enhance the effect of distorting the shape of the light-emitting element itself and, also, it is possible to further reduce the internal resistance value.

Effect of the Invention

According to the present invention, it is possible to elevate the light emission efficiency than ever before in the semiconductor light-emitting element having a main emission wavelength of greater than or equal to 520 nm.

BRIEF DESCRIPTION OF THE DRAWINGS

FIG. 10 is a graph showing the relationship between the main emission wavelength and the internal quantum efficiency.

MODE FOR CARRYING OUT THE INVENTION

Figure 1:
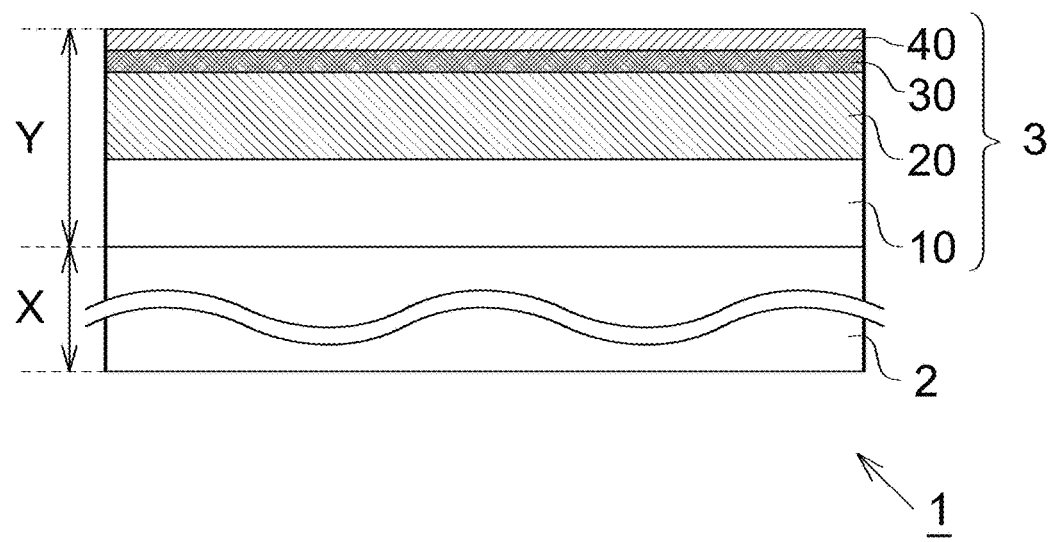
FIG. 1 is a cross-sectional view schematically illustrating the configuration of a nitride semiconductor light-emitting element according to the present embodiment.

There will be described a nitride semiconductor light-emitting element according to the present invention, with reference to the drawings. Further, throughout the respective following drawings, dimension ratios in the drawings are not always coincident with the actual dimension ratios.

In the present specification, the numerical values relating to film thicknesses, compositions, numbers of cycles in multi-layer configurations are merely illustrative. The present invention is not limited to these numerical values.

Further, in the present specification, the expression "AlGaN" has the same meaning as that of the term "$Al_m Ga_{1-m}N$" (0<m<1) and merely describes it in such a way as to omit the composition ratio between the Al and Ga. Therefore, the expression "AlGaN" is not intended to restrict the composition ratio between Al and Ga to 1:1. The same applies to the expressions "InGaN" and "AlInGaN".

[Configurations]

FIG. 1 is a cross-sectional view schematically illustrating the configuration of a nitride semiconductor light-emitting element according to the present embodiment. A nitride semiconductor light-emitting element 1 includes a sapphire substrate 2, and a semiconductor layer 3 formed on the upper surface of the sapphire substrate 2. The semiconductor layer 3 includes an undoped layer 10, an n-type semiconductor layer 20, an active layer 30, and a p-type semiconductor layer 40. The active layer 30 is placed at a position sandwiched between the n-type semiconductor layer 20 and the p-type semiconductor layer 40, in the direction perpendicular to the surface of the sapphire substrate 2. Hereinafter, "the nitride semiconductor light-emitting element 1" will be simply abbreviated as "the light-emitting element 1" in some cases.

The undoped layer 10 is formed to include an undoped GaN layer. As an example, the undoped layer 10 can be constituted by an undoped GaN layer having a thickness of 2 μm. In the present embodiment, the undoped layer 10 corresponds to "a first semiconductor layer".

The n-type semiconductor layer 20 is formed from an n-type semiconductor containing Ga and N. For example, the n-type semiconductor layer 20 is configured to include at least one of an n-type GaN layer, an n-type AlGaN layer and an n-type AlInGaN layer. Namely, the n-type semiconductor layer 20 can be made to have either a single-layer configuration or a multi-layer configuration. As an example, the n-type semiconductor layer 20 can be made to have a laminated-layer configuration constituted by an n-type GaN layer having a thickness of 8 μm, an n-type AlGaN layer having a thickness of 1 μm, an n-type AlInGaN layer having a thickness of 30 nm, and an n-type GaN layer having a thickness of 30 nm. In the present embodiment, the n-type semiconductor layer 20 corresponds to "a second semiconductor layer". Further, the n-type semiconductor layer 20 preferably has an impurity concentration of more than or equal to $1 \times 10^{18}/cm^3$ and more preferably has an impurity concentration of more than or equal to $1 \times 10^{19}/cm^3$.

The active layer 30 is constituted by two or more types of nitride semiconductor layers with different bandgaps which are laminated on each other. Particularly, in the nitride semiconductor light-emitting element 1, the material forming the active layer 30 is determined, such that a main emission wavelength is greater than or equal to 520 nm.

Figure 2:
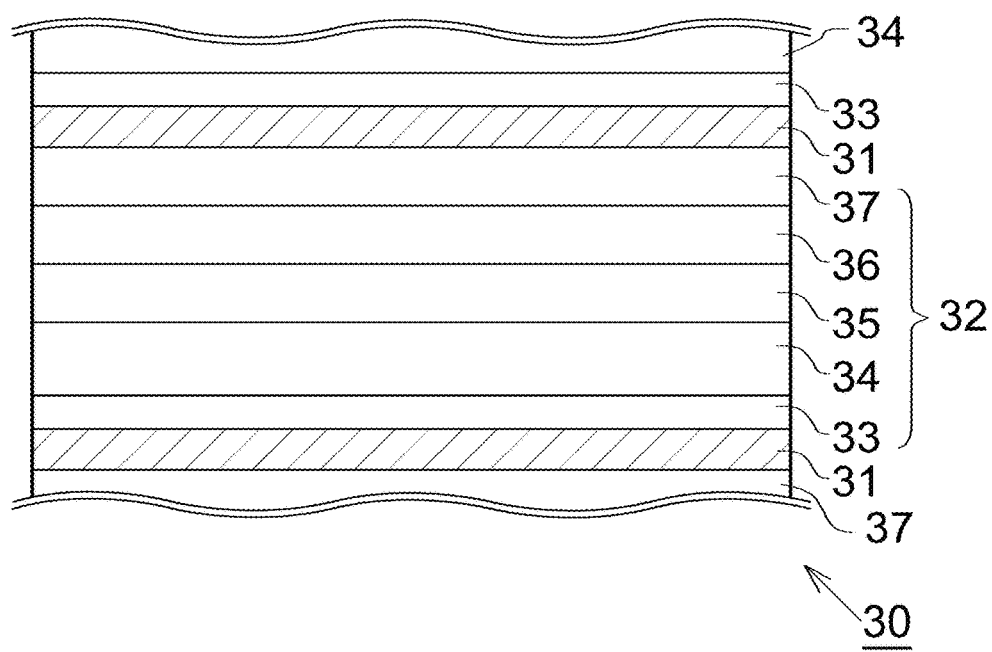
FIG. 2 is an example of a cross-sectional view schematically illustrating a portion of the configuration of the active layer.

FIG. 2 is an example of a cross-sectional view schematically illustrating a portion of the configuration of the active layer 30. The active layer 30 is constituted by a light emitting layer 31, and a barrier layer 32 having a bandgap larger than that of the light emitting layer 31, which are laminated on each other in two or more cycles. As an example, the active layer 30 is constituted by the light emitting layer 31 and the barrier layer 32 which are repeatedly laminated on each other in three cycles.

Further, in the active layer 30, the layer formed at the position in contact with the n-type semiconductor layer 20 can be constituted by either a barrier layer 32 or a light emitting layer 31. Further, in the active layer 30, the layer formed at the position in contact with the p-type semiconductor layer 40 is preferably constituted by a barrier layer 32.

In the present embodiment, each light emitting layer 31 is constituted by an InGaN layer. The bandgap of the light emitting layer 31 is changed depending on the In composition ratio in the InGaN layer. For example, by forming the light emitting layer 31 from $In_{x1}Ga_{1-x1}N$ (0.20≤x1≤0.35), it is possible to make a main emission wavelength of the light-emitting element 1 to range from 520 nm to 580 nm, inclusive. As an example, each light emitting layer 31 can be constituted by an $In_{0.3}Ga_{0.7}N$ layer having a thickness of 2.5 nm.

In the present embodiment, each barrier layer 32 is constituted by plural layers (33, 34, 35, 36, 37). In the example illustrated in FIG. 2, each barrier layer includes a first barrier layer 33 formed from an undoped AlGaN, a second barrier layer 34 formed from an undoped GaN, a third barrier layer 35 formed from an undoped AlGaN, a fourth barrier layer 36 formed from an n-type AlGaN, and a fifth barrier layer 37 formed from an undoped GaN. As a more concrete example, the first barrier layer 33 is constituted by an undoped $Al_{0.5}Ga_{0.5}N$ layer having a thickness of 1.5 nm, the second barrier layer 34 is constituted by an undoped GaN layer having a thickness of 9 nm, the third barrier layer 35 is constituted by an undoped $Al_{0.05}Ga_{0.95}N$ layer having a thickness of 5 nm, the fourth barrier layer 36 is constituted by an n-type $Al_{0.05}Ga_{0.95}N$ layer having a thickness of 4 nm, and the fifth barrier layer 37 is constituted by an undoped GaN layer having a thickness of 5 nm.

However, the structure of the aforementioned barrier layers 32 is merely illustrative. The barrier layers 32 can have either a two-layer configuration constituted by a GaN layer and an AlGaN layer or a single-layer configuration constituted by a GaN layer or an AlGaN layer, for example. Further, each of the layers constituting the barrier layers 32 can be doped with an n-type impurity or a p-type impurity and, also, the respective layers constituting the barrier layers 32 can be all constituted by undoped layers.

Further, the barrier layers 32 are not necessarily required to include all of the respective layers (33, 34, 35, 36, 37), in every cycle. For example, the barrier layers 32 can be also made to include the third barrier layer 35 formed from an undoped AlGaN in a cycle closer to the p-type semiconductor layer 40, while including no third barrier layer 35 in a cycle closer to the n-type semiconductor layer 20.

The p-type semiconductor layer 40 is formed from a p-type semiconductor containing Ga and N. For example, the p-type semiconductor layer 40 is constituted by a p-type GaN layer having a thickness of 100 nm. The p-type semiconductor layer 40 can further include a p-type contact layer formed from a p-type GaN with a higher concentration, on the upper surface of the p-type GaN layer. In the present embodiment, the p-type semiconductor layer 40 corresponds to "a third semiconductor layer".

The light-emitting element 1 is structured such that the thickness X of the sapphire substrate 2 and the thickness Y of the semiconductor layer 3 have a relationship therebetween which satisfies the following formula (1).

$$0.06 \leq Y/X \leq 0.12 \quad (1)$$

In this case, in the semiconductor layer 3, the undoped layer 10 and the n-type semiconductor layer 20 have thicknesses of the order of μm, while the active layer 30 and the p-type semiconductor layer 40 have thicknesses of the order of several tens of nanometers to a hundred of nanometers. Accordingly, the thickness of the semiconductor layer 3 is determined substantially by the thicknesses of the undoped layer 10 and the n-type semiconductor layer 20.

Through earnest studies, the present inventor has found the following. That is, the light emitting efficiency can be increased, in a nitride semiconductor light-emitting element having a main emission wavelengths of greater than or equal to 520 nm, by making the total thickness of the undoped layer 10 and the n-type semiconductor layer 20 with respect to the thickness of the sapphire substrate 2 larger than those of ordinary nitride semiconductor light-emitting elements. This point will be described later with reference to examples, after the description of a method for producing the light-emitting element 1.

Incidentally, in an ordinary nitride semiconductor light-emitting element, the sapphire substrate has a thickness ranging from 120 µm to 200 µm, inclusive, while the undoped layer and the n-type semiconductor layer have a total thickness ranging from 5 µm to 7 µm, inclusive. Accordingly, in an ordinary nitride semiconductor light-emitting element, the Y/X value ranges from 0.025 to 0.058, inclusive.

[Production Method]

There will be described an example of a method for producing the light-emitting element 1 illustrated in FIG. 1. The following production conditions and dimensions such as film thickness are given for illustration, and are not given for limiting the numerical values.

(Step S1)

A sapphire substrate 2 is prepared, and its c-plane is cleaned. More specifically, this cleaning is performed by placing the sapphire substrate 2 within a processing furnace in a MOCVD (Metal Organic Chemical Vapor Deposition) device, for example, and, further, raising the temperature in the furnace (to 1150° C., for example), while flowing a hydrogen gas at a predetermined flow rate within the processing furnace.

(Step S2)

A low-temperature buffer layer formed from GaN is formed on the surface of the sapphire substrate 2. Further, on the upper surface thereof, an underlay layer formed from GaN is formed, thereby forming an undoped layer 10. A method for forming the undoped layer 10 will be described hereinafter in more detail.

At first, the pressure within the furnace and the temperature within the furnace in the MOCVD device are set to predetermined conditions. Further, a nitrogen gas and a hydrogen gas as carrier gasses are flowed at predetermined flow rates into the processing furnace, while trimethylgallium (TMG) and ammonia as material gasses are supplied thereto at predetermined flow rates. As an example, into the processing furnace in the MOCVD device in which the pressure within the furnace is set to 100 kPa and the temperature within the furnace is set to 480° C., a nitrogen gas and a hydrogen gas are each flowed at a flow rate of 5 slm, while TMG at a flow rate of 50 µmol/min and ammonia at a flow rate of 250000 µmol/min are supplied thereto for 68 seconds. As a result thereof, on the surface of the sapphire substrate 2, a low-temperature buffer layer composed of GaN having a thickness of 20 nm is formed.

Next, the temperature within the furnace in the MOCVD device is raised, and the same gasses are supplied to the inside of the processing furnace. For example, into the processing furnace in the MOCVD device in which the temperature within the furnace has been raised to 1150° C., a nitrogen gas at a flow rate of 20 slm and a hydrogen gas at a flow rate of 15 slm are flowed, while TMG at a flow rate of 100 µmol/min and ammonia at a flow rate of 250000 µmol/min are supplied thereto for 40 minutes. As a result thereof, on the surface of the low-temperature buffer layer, an underlay layer composed of GaN having a thickness of 2 µm is formed. The low-temperature buffer layer and the underlay layer form an undoped layer 10.

(Step S3)

An n-type semiconductor layer 20 is formed on the upper surface of the undoped layer 10. An example of a method therefor will be described in more detail hereinafter.

In addition to the same carrier gasses and the same material gasses as those in the step S2, for example, tetraethylsilane is supplied at a predetermined flow rate for a predetermined time period to the inside of the processing furnace, as a material gas for the sake of doping of an n-type impurity. As a result thereof, an n-type GaN layer is formed on the upper surface of the undoped layer 10. Thereafter, Trimethylaluminium (TMA) and Trimethylindium (TMI) as material gasses are further properly added, while the temperature conditions and the pressure conditions within the processing furnace are adjusted, so that an n-type AlGaN layer or an n-type AlInGaN layer is formed. The pressure conditions and the temperature conditions within the processing furnace are properly set according to the material of the semiconductor layer required to be formed. The time period for supplying the gasses are properly set according to the film thickness of the semiconductor layer required to be formed.

As an example, an n-type semiconductor layer 20 is formed on the upper surface of the undoped layer 10, wherein the n-type semiconductor layer 20 is constituted by an n-type GaN layer having a film thickness of 8 µm, an n-type AlGaN layer having a film thickness of 1 µm, an n-type AlInGaN layer having a film thickness of 30 nm, and an n-type GaN layer having a film thickness of 30 nm, which are laminated on each other.

Further, while there has been described a case where Si is employed as the n-type impurity contained in the n-type semiconductor layer 20 in the present embodiment, it is also possible to employ Ge, S, Se, Sn, Te and the like as other n-type impurities. According to the n-type impurity to be contained therein, a material gas is selected, instead of tetraethylsilane.

(Step S4)

An active layer 30 is formed on the upper surface of the n-type semiconductor layer 20. The active layer 30 is formed by repeating a step for forming a light emitting layer 31 and a step for forming a barrier layer 32, two or more times. As an example, there will be described processes in a case where the active layer 30 has the configuration illustrated in FIG. 2.

During the step S4, the pressure within the furnace can be set to about 100 kPa, and the temperature within the furnace can be set to 700° C. to 830° C., in the MOCVD device. Further, the flow rates of a nitrogen gas and a hydrogen gas as carrier gasses, and the flow rate of ammonia as a material gas can be maintained at constant values.

(Step S4a)

In a state where the temperature within the furnace is set to 690° C., for example, and the hydrogen gas, the nitrogen gas and ammonia are supplied thereto, TMI at a flow rate of 27.2 µmol/min and TMG at a flow rate of 15.2 µmol/min, for example, are supplied to the inside of the processing furnace for 54 seconds. As a result thereof, a light emitting layer 31 composed of an undoped In$_{0.3}$Ga$_{0.7}$N layer having a film thickness of 2.6 nm is formed.

In processing for growing InGaN, as in the present step S4a, the growth rate is preferably set to about 3 nm/min, in view of suppressing droplets as much as possible for promoting migration.

(Step S4b)

In a state where the hydrogen gas, the nitrogen gas and ammonia are supplied thereto at the aforementioned flow rates, TMG at a flow rate of 15.2 µmol/min and TMA at a flow rate of 17.3 µmol/min, for example, are supplied to the inside of the processing furnace for 30 seconds. As a result thereof, a first barrier layer 33 composed of an undoped Al$_{0.5}$Ga$_{0.5}$N having a film thickness of 1.5 nm is formed.

(Step S4*c*)

In a state where the temperature within the furnace has been raised to 830° C., and the hydrogen gas, the nitrogen gas and ammonia are supplied thereto at the aforementioned flow rates, TMG at a flow rate of 15.2 μmol/min, for example, is supplied to the inside of the processing furnace for 260 seconds. As a result thereof, a second barrier layer 34 composed of undoped GaN having a film thickness of 9 nm is formed. Further, the second barrier layer 34 can be also formed from InGaN with a lower In composition ratio and, in this case, it is necessary only that TMI at a predetermined flow rate is further added as a material gas.

(Step S4*d*)

In a state where the hydrogen gas, the nitrogen gas and ammonia are continuously supplied thereto at the aforementioned flow rates, TMG at a flow rate of 15.2 μmol/min and TMA at a flow rate of 0.8 μmol/min are supplied to the inside of the processing furnace for 120 seconds. As a result thereof, a third barrier layer 35 composed of an undoped Al$_{0.95}$Ga$_{0.95}$N having a film thickness of 5 nm is formed. Further, in cases where the third barrier layer 35 is formed from AlInGaN with a lower In composition ratio, it is necessary only that TMI at a lower flow rate is additionally supplied thereto.

(Step S4*e*)

In a state where the hydrogen gas, the nitrogen gas and ammonia are supplied thereto at the aforementioned flow rates, TMG at a flow rate of 15.2 μmol/min, TMA at a flow rate of 0.8 μmol/min, and tetraethylsilane at a flow rate of 0.003 μmol/min for the sake of doping of an n-type impurity are supplied to the inside of the processing furnace for 96 seconds. As a result thereof, a fourth barrier layer 36 composed of an n-type Al$_{0.95}$Ga$_{0.95}$N having a film thickness of 4 nm is formed. Further, in cases where the fourth barrier layer 36 is formed from AlInGaN with a lower In composition ratio, it is necessary only that TMI at a lower flow rate is additionally supplied thereto.

(Step S4*f*)

In a state where the hydrogen gas, the nitrogen gas and ammonia are continuously supplied thereto at the aforementioned flow rates, TMG at a flow rate of 15.2 μmol/min is supplied to the inside of the processing furnace for 130 seconds. As a result thereof, a fifth barrier layer 37 composed of an undoped GaN having a film thickness of 5 nm is formed.

The aforementioned steps S4*a* to S4*f* are repeatedly performed two or more times to form an active layer 30 constituted by light emitting layers 31 and barrier layers 32 which are laminated on each other in two or more cycles.

As described above, it is not necessarily needed to provide the same structure in each cycle in the active layer 30. Namely, in the present step S4, it is possible to employ different producing conditions for the respective cycles.

(Step S5)

A p-type semiconductor layer 40 is formed on the upper surface of the active layer 30. An example of a method therefor will be described in detail hereinafter.

The pressure within the furnace and the temperature within the furnace in the MOCVD device are set to be predetermined conditions. Further, a nitrogen gas and a hydrogen gas as carrier gasses are flowed at predetermined flow rates to the inside of the processing furnace, while TMG and ammonia as material gasses, and Bis-cyclopentadienyl magnesium (Cp$_2$Mg) for the sake of doping of a p-type impurity are supplied thereto at predetermined flow rates. As an example, into the processing furnace in which the pressure within the furnace is set to 100 kPa, a nitrogen gas at a flow rate of 15 slm and a hydrogen gas at a flow rate of 25 slm are flowed, as carrier gasses, while the temperature within the furnace is raised to 930° C. Thereafter, while the carrier gasses are uninterruptedly flowed into the processing furnace, TMG at a flow rate of 100 μmol/min, ammonia at a flow rate of 250000 μmol/min, and Cp$_2$Mg at a flow rate of 0.1 μmol/min are supplied to the inside of the processing furnace for 360 seconds. As a result thereof, a p-type semiconductor layer 40 composed of a p-type GaN having a thickness of 120 nm is formed on the upper surface of the active layer 30.

Further, subsequently, a contact layer composed of a high concentration p-type GaN layer having a thickness of 5 nm may be formed by feeding the source gas for 20 seconds after changing the flow rate of Cp$_2$Mg to 0.3 μmol/min. In this case, the p-type semiconductor layer 40 further includes this contact layer.

While the case of using Mg as a p-type impurity contained in the p-type semiconductor layer 40 is described in the above embodiment, Be, Zn, C and the like may be used besides Mg. According to the p-type impurity to be contained therein, a material gas is selected, instead of Cp$_2$Mg.

(Subsequent Processing)

Etching is performed on the p-type semiconductor layer 40 and the active layer 30 within a partial area thereof, through ICP etching, so that a portion of the upper surface of the n-type semiconductor layer 20 is exposed. Further, an n-side electrode is formed on the exposed upper surface of the n-type semiconductor layer 20, and a p-side electrode is formed on the upper surface of the p-type semiconductor layer 40. Further, the respective elements are separated from each other through a laser dicing device, for example, and wire bonding is performed on the electrodes.

EXAMPLES

Hereinafter, the present invention will be described with reference to examples.

Figures 3A, 3B:
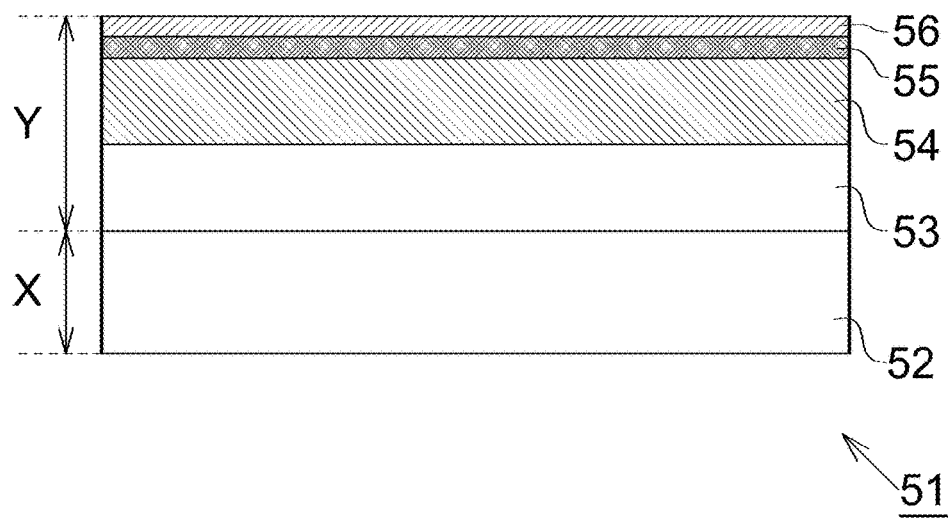
FIG. 3A is a table of comparisons in light emitting efficiency, between light-emitting elements produced wherein the thickness of the sapphire substrate and the thickness of the semiconductor layer were properly varied.
FIG. 3B is a cross-sectional view illustrating the configuration of the light-emitting element for comparison.

FIG. 3A is a table of comparisons in light emitting efficiency (EQE), between light-emitting elements produced based on the aforementioned processes, wherein the thickness of the sapphire substrate 2 and the thickness of the semiconductor layer 3 were properly varied. Here, an element for comparison therewith had a configuration as follows.

FIG. 3B is a cross-sectional view illustrating the configuration of the light-emitting element for comparison, in the same manner as in FIG. 1. The light-emitting element 51 for comparison, which is illustrated in FIG. 3B, included an undoped layer 53 on the upper surface of a sapphire substrate 52, an n-type semiconductor layer 54 on the upper surface of the undoped layer 53, an active layer 55 on the upper surface of the n-type semiconductor layer 54, and a p-type semiconductor layer 56 on the upper surface of the active layer 55.

The sapphire substrate 52 had a thickness of 120 μm. The undoped layer 53 had a thickness of 3 μm. The n-type semiconductor layer 54 had a thickness of 3 μm. The active layer 55 had a thickness of 100 nm. The p-type semiconductor layer 56 had a thickness of 100 nm. Namely, in the element 51, the thickness X of the sapphire substrate 52 was equal to 120 μm, and the total thickness Y of the semiconductor layer (53, 54, 55, 56) was equal to 6.2 μm and, therefore, Y/X was equal to 0.052. This is a value ranging from 0.025 to 0.058, inclusive, which is the range of Y/X values in the aforementioned ordinary nitride semiconductor light-emitting elements.

Actually, in forming the light-emitting elements 1 according to the present embodiment and the light-emitting element 51 for comparison, a p-side electrode composed of Cr/Ni/Au was formed on the upper surface of the p-type semiconductor layer (40, 56) in both of them. Further, as described above, etching was performed on the p-type semiconductor layer (40, 56) and the active layer (30, 55) within a partial area thereof, so that the n-type semiconductor layer (20, 54) was exposed. An n-side electrode composed of Cr/Ni/Au was formed on the upper surface of the exposed n-type semiconductor layer (20, 54). In both of the light-emitting elements 1 according to the present embodiment and the light-emitting element 51 for comparison, a reflective layer composed of Al was formed on the back surface of the sapphire substrate (2, 52), in order to extract light through the p-type semiconductor layer (40, 56) side.

Referring to FIG. 3A, elements which had light emitting efficiency improved over the element for comparison were evaluated as "A", while elements which were not recognized as having light emitting efficiency improved over the element for comparison were evaluated as "B". Further, in FIG. 3, evaluations "C" indicate elements which could not be evaluated regarding the light emitting efficiency, due to breakage of the sapphire substrate 2 therein.

Referring to FIG. 3A, when the thickness X of the sapphire substrate 2 was set to 60 μm, for example, the light emitting efficiency was not improved when the thickness Y of the semiconductor layer 3 was set to 3 μm and, further, the light emitting efficiency was not improved when the thickness Y of the semiconductor layer 3 was set to 9 μm, but the light emitting efficiency was improved when the thickness Y of the semiconductor layer 3 was set to 6 μm. However, even when the thickness Y of the semiconductor layer 3 was set to 6 μm, the light emitting efficiency was not improved, when the thickness X of the sapphire substrate 2 was set to 120 μm. From these facts, it is expected that the light emitting efficiency was improved over the element for comparison, when the thickness X of the sapphire substrate 2 and the thickness Y of the semiconductor layer 3 satisfied some relationship therebetween.

Figure 4:
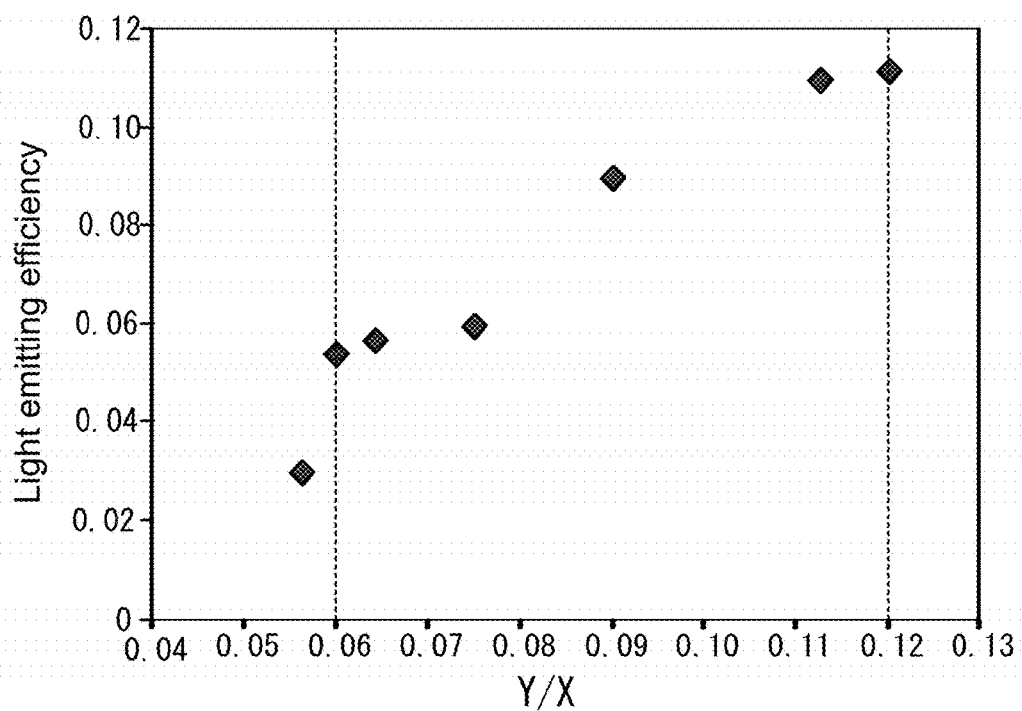
FIG. 4 is a graph illustrating the relationship between the light emitting efficiency, and the ratio of the thickness Y of the semiconductor layer to the thickness X of the sapphire substrate.

FIG. 4 is a graph illustrating the relationship between the light emitting efficiency, and the ratio of the thickness Y of the semiconductor layer 3 to the thickness X of the sapphire substrate 2. When the Y/X value exceeded 0.12, the sapphire substrate 2 was broken, which made it impossible to observe light emission. Incidentally, the element for comparison had light emitting efficiency of 0.03 at an emission wavelength of 550 nm.

Referring to FIG. 4, it is possible to increase the light emitting efficiency, by structuring the light-emitting element 1 such that Y/X value ranges from 0.06 to 0.12, inclusive. Regarding this point, hereinafter, there will be described the reason therefor which is considered by the present inventor.

Figure 5:
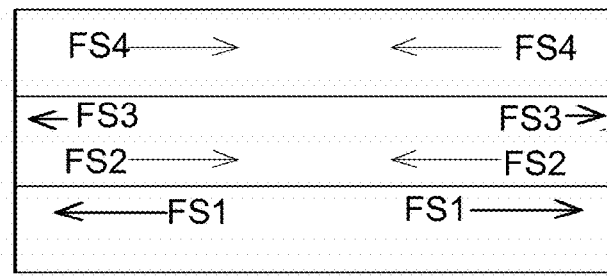
FIG. 5 is a view schematically and additionally illustrating stresses exerted on the respective layers, when the semiconductor layer has been grown on the upper surface of the sapphire substrate.
Figure 5:
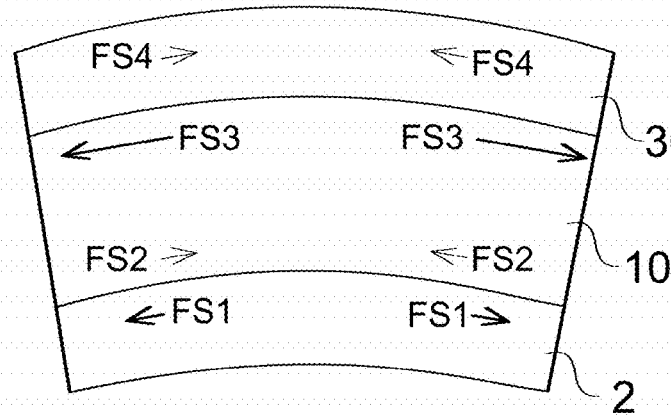

FIG. 5 is a view schematically and additionally illustrating stresses exerted on the respective layers, when the semiconductor layer 3 has been grown on the upper surface of the sapphire substrate 2. In FIG. 5, there are illustrated only the undoped layer 10, the n-type semiconductor layer 20 and the active layer 30 as the semiconductor layer 3. As described above, the undoped layer 10 and the n-type semiconductor layer 20 have extremely larger film thicknesses, in comparison with the active layer 30 and the p-type semiconductor layer 40. Therefore, the thickness of the semiconductor layer 3 can be substantially approximated to the sum of the thicknesses of the undoped layer 10 and the n-type semiconductor layer 20.

FIG. 5(a) is a view schematically and additionally illustrating stresses exerted on the respective layers, in a case where the thicknesses of the sapphire substrate 2 and the semiconductor layer 3 are realized to be conventionally-assumed thicknesses.

It has been known that, in cases where GaN (an undoped layer 10 in this case) is grown on the c-plane of a sapphire substrate 2, the GaN is grown such that the a-axis of the GaN exists at a position which is rotated by 30° from the a-axis of the sapphire. In this case, the sapphire has a lattice constant of about 0.279 nm in the direction parallel to the a-axis direction of the GaN, and the GaN has a lattice constant smaller than 0.319 nm by about 16% in the a-axis direction. Therefore, a force attempting to shrink the GaN, namely a compressive stress FS2, is exerted on the GaN from the sapphire thereunder. On the contrary, a tensile stress FS1 is induced in the sapphire.

Further, in the active layer 30, the light emitting layers 31 are formed from InGaN with a higher In composition ratio. In this case, InN has a lattice constant of about 0.354 nm in the a-axis direction, which is larger than the lattice constant of GaN in the a-axis direction. Therefore, for the same reason, a compressive stress FS4 is exerted on the light emitting layers 31, from the GaN thereunder. On the contrary, a tensile stress FS3 is exerted on the layers (10, 20) containing GaN thereunder, from the active layer 30.

Accordingly, when the InGaN has been coherently grown on the GaN, a piezoelectric field is induced within the active layer 30 due to the compressive stress FS4 induced in the active layer 30, which induces distortion in the energy band. As the In composition ratio in the InGaN is increased, the difference in lattice constant between the InGaN and the GaN is increased, thereby inducing larger distortion in the energy band. This results in reduction of the probability of recombination between electrons and holes. This point is the reason for the circumstance that only lower light emitting efficiency has been conventionally realized with nitride semiconductor light-emitting elements having main emission wavelengths of 520 nm or more.

Incidentally, the light-emitting element 1 according to the present embodiment is structured such that the thickness X of the sapphire substrate 2 and the thickness Y of the semiconductor layer 3 have the relationship of 0.06≤Y/X therebetween. Namely, the light-emitting element 1 is structured, such that the thickness X of the sapphire substrate 2 is made relatively smaller, or the thickness Y of the semiconductor layer 3, namely the thickness of the undoped layer 10 or the n-type semiconductor layer 20 is made relatively larger. FIG. 5(b) is a view schematically and additionally illustrating stresses exerted on the respective layers, when the light-emitting element 1 has been realized in such a way as to form the thicknesses of the sapphire substrate 2 and the semiconductor layer 3 under this condition.

As described regarding the step S2, after the low-temperature buffer layer has been grown on the upper surface of the sapphire substrate 2, a semiconductor layer is epitaxially grown in a state where the temperature within the processing furnace is set to about 1000 to 1100 degree.

Here, the sapphire substrate 2 has a thermal expansion coefficient of about $7.9 \times 10^{-6}$/K, while the GaN-based semiconductor layer forming the undoped layer 10 or the n-type semiconductor layer 20 has a thermal expansion coefficient of about $5.5 \times 10^{-6}$/K. Namely, the sapphire substrate 2 has a thermal expansion coefficient larger by about $2 \times 10^{-6}$/K than that of the GaN-based semiconductor layer. Therefore, when the wafer has been extracted to the outside of the processing furnace and has been decreased in temperature, after the completion of the epitaxially-growing process, the sapphire substrate 2 shrinks more largely than the undoped layer 10 and the n-type semiconductor layer 20.

At this time, when the sapphire substrate 2 has a thickness which is relatively smaller in comparison with those of the undoped layer 10 and the n-type semiconductor layer 20, the sapphire substrate 2 warps upwardly in a convex shape, due to compressive stresses induced in the sapphire substrate 2 during shrinkage thereof. As a result thereof, the undoped layer 10 composed of GaN at the position closest to the sapphire substrate 2 is stretched in the plane direction of the sapphire substrate 2, thereby substantially increasing the lattice spacing therein. This results in reduction of the compressive stress FS2 having been induced in the undoped layer 10 due to the lattice mismatch and, similarly, results in reduction of the tensile stress FS1 having been induced in the sapphire substrate 2.

Further, in the n-type semiconductor layer 20 formed at the position closest to the active layer 30, the tensile stress FS3 is increased, due to the stretching of the undoped layer 10 in the plane direction. As a result thereof, the lattice spacing in the n-type semiconductor layer 20 is enlarged to get closer to the lattice spacing in the InGaN which forms the active layer 30. This decreases the compressive stress FS4 having been induced in the active layer 30, thereby decreasing the piezoelectric field in the active layer 30. This reduces the inclination of the energy band in the light emitting layers 31, which increases the recombination probability. Accordingly, it is considered that the light emitting efficiency is increased.

Figure 6:
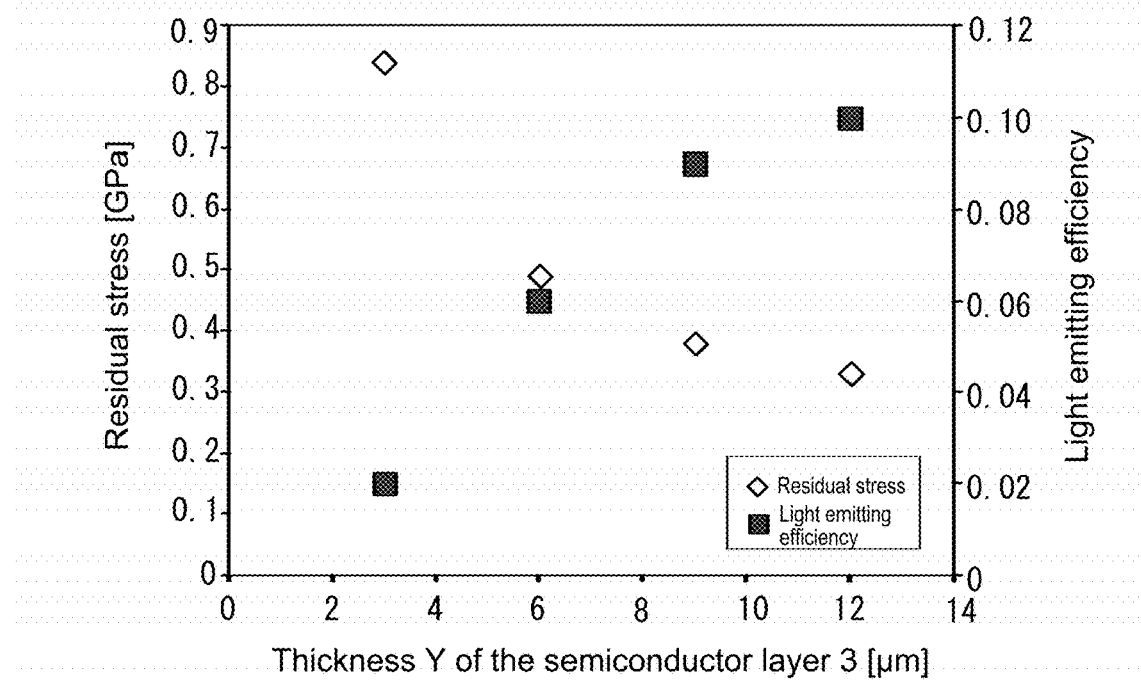
FIG. 6 is a graph illustrating the relationship between the thickness of the semiconductor layer and the residual stress induced in the wafer after the epitaxial growth thereon, and the relationship between the thickness of the semiconductor layer and the light emitting efficiency.

FIG. 6 is a graph illustrating the relationship between the thickness of the semiconductor layer 3 and the residual stress induced in the wafer after the epitaxial growth thereon, and the relationship between the thickness of the semiconductor layer 3 and the light emitting efficiency, when each light-emitting element 1 was produced, such that the thickness of the sapphire substrate 2 was fixed to 100 μm, and the thickness of the semiconductor layer 3 was varied. In FIG. 6, the horizontal axis corresponds the thickness of the semiconductor layer 3, while the left vertical axis corresponds to the residual stress and the right vertical axis corresponds to the light emitting efficiency. Further, the residual stress σ was calculated according to the Stoney formula described as the following formula (2).

$$\Sigma = E \cdot X^2 / [6 \cdot (1-V) \cdot R \cdot Y] \quad (2)$$

In the formula (2), "E" corresponds to the Young's modulus of the sapphire substrate 2, "X" corresponds to the thickness of the sapphire substrate 2, "V" corresponds to the Poisson's ratio of the sapphire substrate 2, "R" corresponds to the radius of curvature of the semiconductor layer 3, and "Y" corresponds to the thickness of the semiconductor layer 3. In the calculation, the residual stress was calculated assuming E=345 (Gpa) and V=0.25. Further, as the radius of curvature "R" of the semiconductor layer 3, a value measured through X-ray diffraction on the wafer was employed. As the thickness X of the sapphire substrate 2 and the thickness Y of the semiconductor layer 3, the conditions in the production of each light-emitting element were employed.

Referring to FIG. 6, it can be seen that, as the thickness Y of the semiconductor layer 3 was increased, the residual stress 6 was decreased and, also, the light emitting efficiency was increased.

Figure 7:
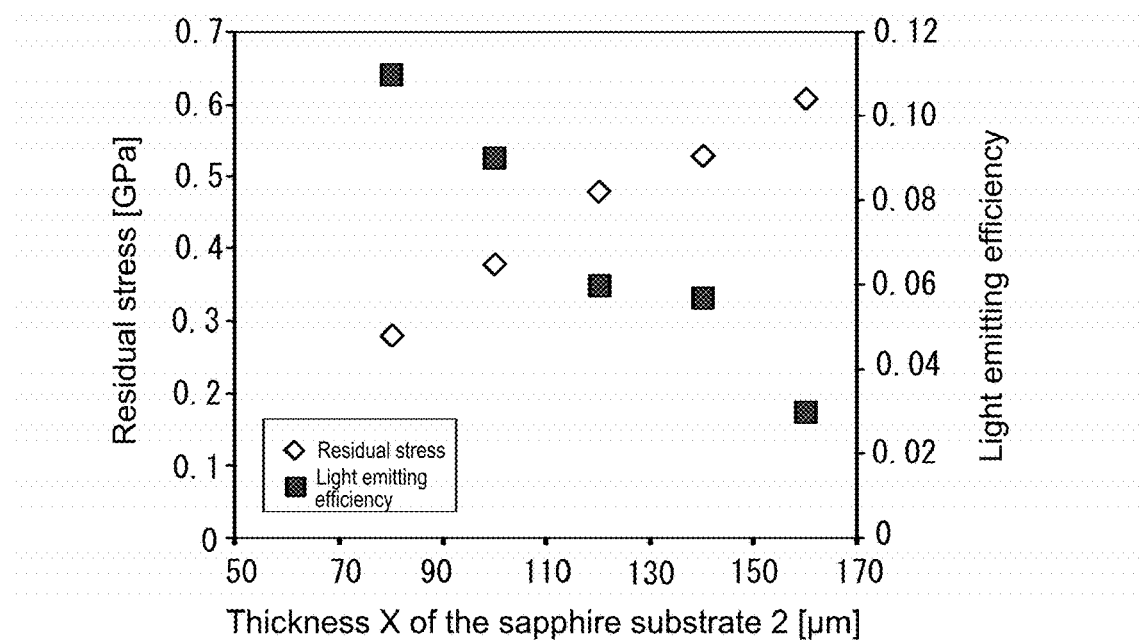
FIG. 7 is a graph illustrating the relationship between the thickness of the sapphire substrate and the residual stress induced in the wafer after the epitaxial growth thereon, and the relationship between the thickness of the semiconductor layer and the light emitting efficiency.

FIG. 7 is a graph illustrating the relationship between the thickness of the sapphire substrate 2 and the residual stress induced in the wafer after the epitaxial growth thereon, and the relationship between the thickness of the semiconductor layer 3 and the light emitting efficiency, when each light-emitting element 1 was produced, such that the thickness of the semiconductor layer 3 was fixed to 9 μm, while the thickness of the sapphire substrate 2 was varied. The residual stress was calculated according to the same method as that of FIG. 6.

Referring to FIG. 7, it can be seen that, as the thickness X of the sapphire substrate 2 was decreased, the residual stress 6 was decreased and, also, the light emitting efficiency was increased.

The results in FIGS. 6 and 7 are coincident with the aforementioned consideration. Namely, the following is considered. That is, if the thickness X of the sapphire substrate 2 was made relatively smaller with respect to the thickness Y of the semiconductor layer 3, warpage was induced in the sapphire substrate 2 such that its side closer to the active layer 30 was convex, thereby exerting a force on the active layer 30 in such a direction as to alleviate the internal stress therein, after the epitaxial growth. It is assumed that, as a result thereof, the piezoelectric field in the active layer 30 was alleviated, thereby improving the light emitting efficiency.

Further, from earnest studies, the present inventor has proven that it is possible to realize light emission with no unevenness, in addition to the aforementioned improvement of the light emitting efficiency, by forming the semiconductor layer 3 from a thick film. This point will be described with reference to photographs in FIGS. 8 and 9.

Figure 8:
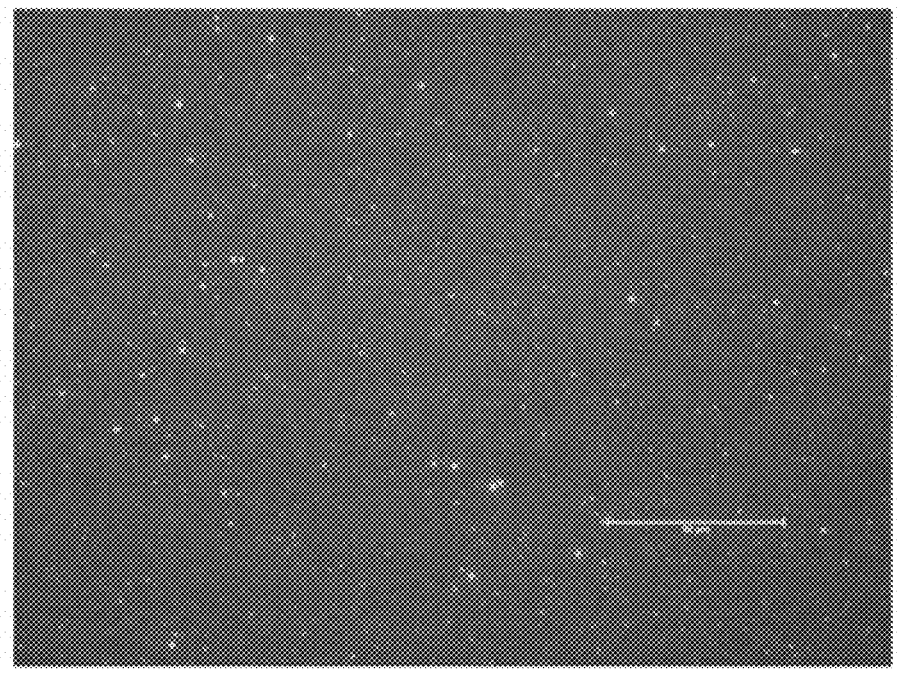
FIG. 8 is photographs of light emitting states of the light-emitting elements with an electric current to emit light, taken by a fluorescence microscope, wherein the light-emitting elements were produced such that the thickness of the semiconductor layer were varied.
Figure 8:
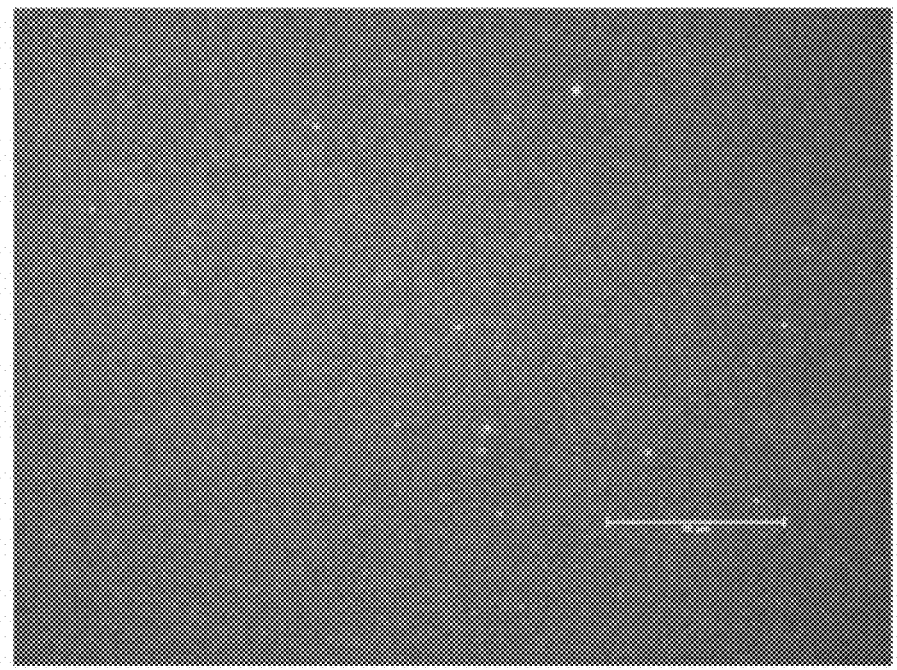
Figure 9:
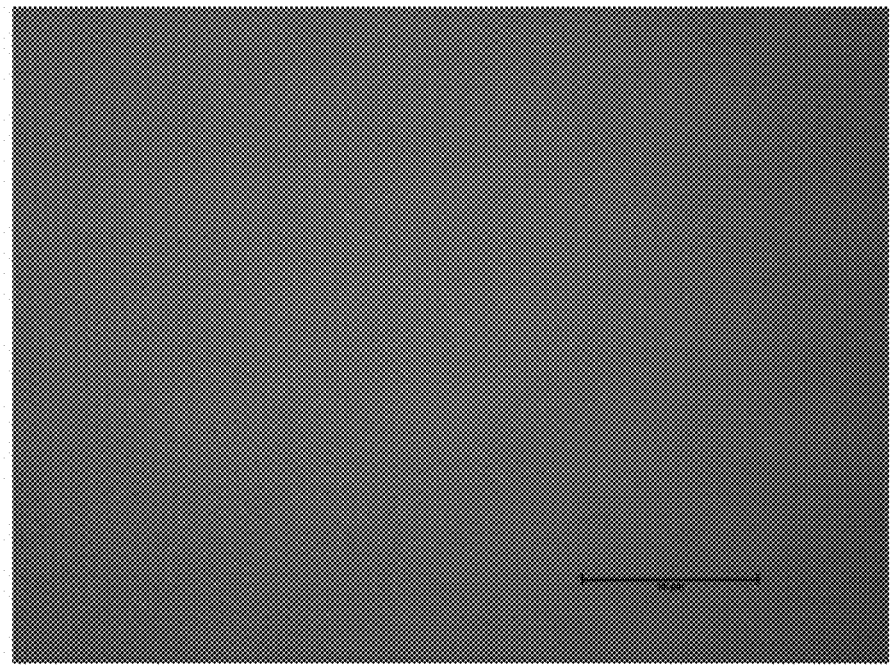
FIG. 9 is photographs of light emitting states of the light-emitting elements with an electric current to emit light, taken by a fluorescence microscope, wherein the light-emitting elements were produced such that the thickness of the semiconductor layer were varied.
Figure 9:
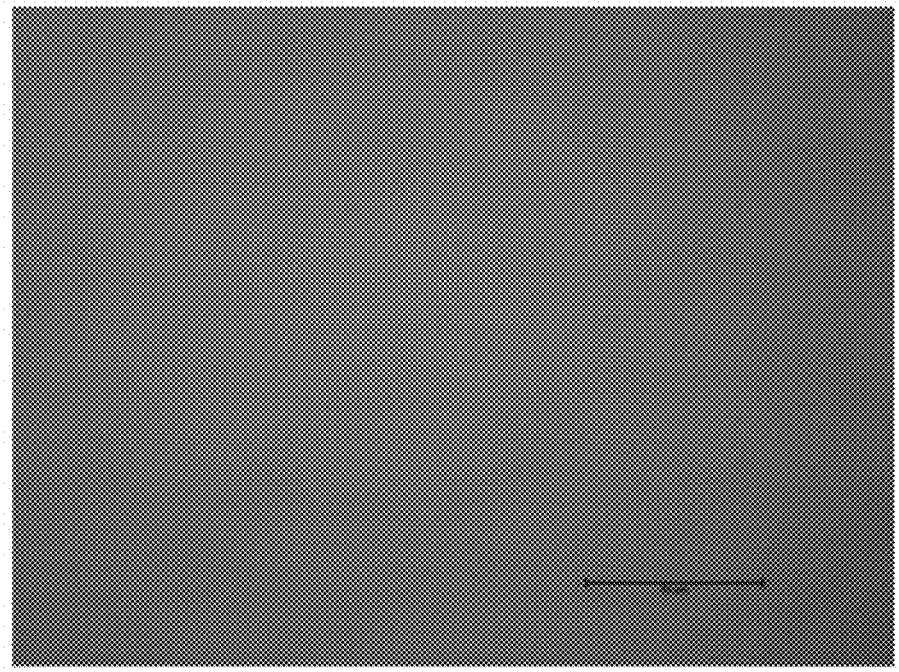

FIGS. 8 and 9 are both photographs of light emitting states of light-emitting elements when the light-emitting elements were being actually supplied with an electric current to emit light, wherein these photographs were taken by a fluorescence microscope, and these light-emitting elements were produced such that the thickness of the semiconductor layer 3, more specifically one or both of the thicknesses of the undoped layer 10 and the n-type semiconductor layer 20 were varied. FIG. 8(a) is a photograph of when the semiconductor layer 3 had a thickness of 4 μm. FIG. 8(b) is a photograph of when the semiconductor layer 3 had a thickness of 5 μm. FIG. 9(a) is a photograph of when the semiconductor layer 3 had a thickness of 6 μm. FIG. 9(b) is a photograph of when the semiconductor layer 3 had a thickness of 10 μm. In FIGS. 8(a) and 8(b), appearance of white spots in the photographs can be observed, which indicates that there were dot-shaped areas with higher luminances. Further, in FIGS. 9(a) and 9(b), white spots as those seen in FIGS. 8(a) and 8(b) are not observed. Namely, it was proven that, when the light-emitting elements 1 formed such that the thickness of the semiconductor layer 3 was equal to or more than 6 μm were lighted, dot-shaped luminance spots were disappeared, and the entire surfaces thereof uniformly emitted light.

When the thickness of the semiconductor layer 3 is made larger, such dot-shaped luminance spots are not observed. The reason for this fact is unknown, but the present inventor has considered as follows.

As described above, the light emitting layers 31 are formed from a nitride semiconductor containing In. In producing them, an organic metal material gas such as trimethylgallium (TMG) or trimethylindium (TMI) for the sake of forming the nitride semiconductor is supplied together with carrier gasses to the inside of the device for growing a crystal. At this time, the material gas containing In has an extremely higher equilibrium vapor pressure than those of the other gasses. Therefore, it is necessary to grow the crystal at a lower growth temperature. As a result thereof, In contained in the gas is prone to segregation in the InGaN layers, which tends to degrade the quality of the crystal.

The light-emitting element 1 according to the present embodiment is structured, such that the thickness X of the sapphire substrate 2 is relatively smaller in comparison with the thickness Y of the semiconductor layer 3 or the thickness Y of the semiconductor layer 3 is relatively larger in comparison with the thickness X of the sapphire substrate 2. Therefore, it is considered that, due to the change of internal stresses in the light emitting layers 31, In is introduced therein in a different way, in comparison with conventional structures, which results in changes of conditions of growth of the InGaN layers, thereby improving the crystal quality.

If dot-shaped luminance spots are induced as in the photographs in FIGS. 8(a) and 8(b), this induces local concentrations of electric currents at these positions. This may induce local temperature rises, which may induce leak currents, thereby degrading the life characteristics.

Namely, with the aforementioned structure, it is possible to improve the light emitting efficiency and, further, it is possible to improve the in-plane uniformity of light emitting states, thereby improving the life characteristics.

Further, by structuring the n-type semiconductor layer 20 such that it includes an AlGaN layer or an AlInGaN layer, it is possible to induce larger warpage in the sapphire substrate 2 after the completion of the epitaxial growth. This results in further enhancement of the effect of reducing the piezoelectric field in the active layer 30.

Other Embodiments

Hereinafter, other embodiments will be described.

<1> There has been described, in the aforementioned embodiment, a case where the active layer 30 included in the light-emitting element 1 includes the light emitting layers 31 and a plurality of the barrier layers 32 which are periodically formed therein. Incidentally, in the light-emitting element 1, the thickness Y of the semiconductor layer 3 is made relatively larger in comparison with the thickness X of the sapphire substrate 2, in order to reduce the piezo electric field induced due to the provision of the nitride semiconductor layer with a relatively higher In composition ratio on the upper surface of the GaN layer, thereby enhancing the light emitting efficiency. Accordingly, the active layer 30 is required only to include the light emitting layers 31 formed from a nitride semiconductor containing In and to have a structure capable of emitting light with a main emission wavelength of 520 nm or more. The active layer 30 is not limited to the structure described in the aforementioned embodiment.

<2> In the present specification, the term "undoped" includes states of having been doped with no impurity at all as a matter of course and, also, includes states of having been doped with minute amounts of impurities. More specifically, the term "undoped" indicates states of having impurity concentrations equal to or less than detection limits as a matter of course and, also, includes states of having impurity concentrations within the range of equal to or higher than detection limits but equal to or less than $1 \times 10^{17}/\text{cm}^3$.

As an example, in the aforementioned embodiment, there has been described a case where the undoped layer 10 is formed on the upper surface of the sapphire substrate 2 and, on the upper surface thereof, the n-type semiconductor layer 20 is formed. However, it is also possible to form a semiconductor layer doped with a minute amount of impurity, instead of the undoped layer 10, on the upper surface of the sapphire substrate 2.

Similarly, in the aforementioned embodiment, there has been described a case where the first barrier layer 33 and the third barrier layer 35 are formed from an undoped AlGaN, and the second barrier layer 34 and the fifth barrier layer 37 are formed from an undoped GaN. However, it is also possible to form these respective barrier layers from semiconductor layers doped with minute amounts of impurity.

DESCRIPTION OF REFERENCE SIGNS

1: nitride semiconductor light-emitting element
2: sapphire substrate
3: semiconductor layer
10: undoped layer
20: n-type semiconductor layer
30: active layer
31: light emitting layer
32: barrier layer
33: first barrier layer
34: second barrier layer
35: third barrier layer
36: fourth barrier layer
37: fifth barrier layer
40: p-type semiconductor layer
51: light-emitting element for comparison
52: sapphire substrate
53: undoped layer
54: n-type semiconductor layer
55: active layer
56: p-type semiconductor layer

The invention claimed is:

1. A nitride semiconductor light-emitting element having a main emission wavelength of 520 nm or more,
the nitride semiconductor light-emitting element comprising a sapphire substrate and a semiconductor layer formed on an upper surface of the sapphire substrate, wherein
the semiconductor layer includes
a first semiconductor layer which is formed on a surface of the sapphire substrate and is formed from a nitride semiconductor containing Ga,
a second semiconductor layer which is formed on an upper surface of the first semiconductor layer and is formed from a nitride semiconductor containing Ga and doped with an n-type impurity with a higher concentration than that of the first semiconductor layer,
an active layer which is formed on an upper surface of the second semiconductor layer and includes light emitting layers formed from a nitride semiconductor containing In and Ga and barrier layers formed from a nitride semiconductor containing Ga which are laminated on each other in two or more cycles, and
a third semiconductor layer which is formed on an upper surface of the active layer and is formed from a nitride semiconductor containing Ga and doped with a p-type impurity, and
a thickness X of the sapphire substrate and a thickness Y of the semiconductor layer satisfy a relationship in the following formula (1)

$$0.06 \leq Y/X \leq 0.12 \tag{1}$$

2. The nitride semiconductor light-emitting element according to claim 1, wherein
the semiconductor layer has a thickness of 6 μm or more.

3. The nitride semiconductor light-emitting element according to claim 2, wherein
the second semiconductor layer has a thickness larger than a thickness of the first semiconductor layer.

4. The nitride semiconductor light-emitting element according to claim 1, wherein
the second semiconductor layer includes a layer formed from a nitride semiconductor containing Al and Ga.

5. The nitride semiconductor light-emitting element according to claim 1, wherein
the first semiconductor layer is formed from an undoped nitride semiconductor.

6. The nitride semiconductor light-emitting element according to claim 2, wherein
the second semiconductor layer includes a layer formed from a nitride semiconductor containing Al and Ga.

7. The nitride semiconductor light-emitting element according to claim 3, wherein
the second semiconductor layer includes a layer formed from a nitride semiconductor containing Al and Ga.

8. The nitride semiconductor light-emitting element according to claim 2, wherein
the first semiconductor layer is formed from an undoped nitride semiconductor.

9. The nitride semiconductor light-emitting element according to claim 3, wherein
the first semiconductor layer is formed from an undoped nitride semiconductor.

10. The nitride semiconductor light-emitting element according to claim 4, wherein
the first semiconductor layer is formed from an undoped nitride semiconductor.

11. The nitride semiconductor light-emitting element according to claim 6, wherein
the first semiconductor layer is formed from an undoped nitride semiconductor.

12. The nitride semiconductor light-emitting element according to claim 7, wherein
the first semiconductor layer is formed from an undoped nitride semiconductor.

* * * * *